United States Patent [19]

Dermitzakis et al.

[11] Patent Number: 4,914,402
[45] Date of Patent: Apr. 3, 1990

[54] OPTO-ELECTRONIC TRANSIMPEDANCE AMPLIFIER

[75] Inventors: Stefanos Dermitzakis, Heilbronn-Neckargartach; Jasbeer-Singh Suri, Heilbronn-Klingenberg, both of Fed. Rep. of Germany

[73] Assignee: Telefunken electronic GmbH, Heilbronn, Fed. Rep. of Germany

[21] Appl. No.: 306,682

[22] Filed: Feb. 6, 1989

[30] Foreign Application Priority Data

Feb. 27, 1988 [DE] Fed. Rep. of Germany ....... 3806283

[51] Int. Cl.[4] .............................................. H03F 3/08
[52] U.S. Cl. ...................................... 330/308; 330/311
[58] Field of Search ................. 330/59, 308, 310, 311, 330/300

[56] References Cited

U.S. PATENT DOCUMENTS 4,564,818  1/1986  Jones ................................. 330/308 X
4,750,217  6/1988  Smith et al. ....................... 330/308 X

FOREIGN PATENT DOCUMENTS 3204839  9/1983  Fed. Rep. of Germany .
3223218  2/1984  Fed. Rep. of Germany .

Primary Examiner—Steven Mottola
Attorney, Agent, or Firm—Spencer & Frank

[57] ABSTRACT

In an opto-electronic transimpedance amplifier for the amplification of optical signals supplied by a photovoltaic cell and having a transistor as amplifier, the load resistor of the amplifier transistor is a transistor and two ohmic resistors whose series connection is parallel to the emitter-to-collector path of the load resistor transistor and whose connection point is connected to the base of the load resistance transistor.

16 Claims, 2 Drawing Sheets

OPTO-ELECTRONIC TRANSIMPEDANCE AMPLIFIER

BACKGROUND OF THE INVENTION

Transimpedance amplifiers are frequently used for preamplification of opto-electronic signals from photodiodes. Transimpedance amplifiers are constructed of operational amplifiers or of discrete components (bipolar or FET). Here, circuits of discrete components (bipolar or FET) are preferred for higher frequencies and low noise over circuits made from operational amplifiers.

In all photodiode preamplifiers, and particularly in transimpedance amplifiers, the high dynamics which the optical signal hitting the photodiode may have represent a considerable problem. The power of the incident optical signal can be between 10 nW and several mW depending on the distance from the transmitter or the type of optical coupling. The dynamics of the photocurrents generated in the photodiode and forming the input signal of the preamplifier are correspondingly high. Since preamplifiers are optimized for very low input currents and have limited dynamics, preamplifiers are overloaded relatively quickly by the photocurrents. This considerably affexts or even nullifies the function of preamplifiers.

FIG. 1 shows a solution for a transimpedance amplifier with overload protection. In the transimpedance amplifier according to FIG. 1 a diode D is connected parallel to the feedback resistor RF. If the voltage drop from the resistor RF is greater that approx. 0.5 V, the diode D switches on and bridges the resistor RF with the substantially smaller diode flow resistance. Since the resistor RF determines the amplification (transimpedance), amplification is thereby decreased and overload is avoided. In this way it is possible to achieve an overload protection with a factor of 30 to 50.

Drawbacks of the arrangement according to FIG. 1 are the relatively low bandwidth, the signal distortions occurring with large signals and high frequencies, and the relatively low overload factor achievable.

Since the overload protection only acts on the feedback resistor (RF) and not on the load resistor Rc, the voltage drop from Rc rises very quickly with the collector current of Q1, so that transistor Q1 becomes saturated. Saturation generates delays and distortions in the signal, i.e. the overload protection is practically nullified and limited to low optical power values. Further drawbacks arise from the protective diode D1 itself that is used. Diode D1 corresponds to a capacitance which is parallel to resistor RF and which considerably reduces the bandwidth of the amplifier. In addition, the entire capacitance is strongly reversecharged, particularly in the case of pulse-like signals and overload, by the changing voltage from RF, so generating unwelcome snap-off effects and additional distortion of the signal.

SUMMARY OF THE INVENTION

The object underlying the invention is to provide an optoelectronic transimpedance amplifier affording protection from overload. The hynamic properties of the transimpedance amplifier must be altered as little as possible by the overload protection.

According to the invention, there is provided a transimpedance amplifier for the amplification of optical signals supplied by a photovoltaic cell, having a transistor as an amplifier. As the load resistor of the amplifier transistor, a transistor and two ohmic resistors are provided, whose series connection is parallel to the emitter-to-collector path of the load resistor transistor and whose connection point is connected to the base of the load resistor transistor.

DESCRIPTION OF THE PREFERRED EMBODIMENTS

Figure 1:
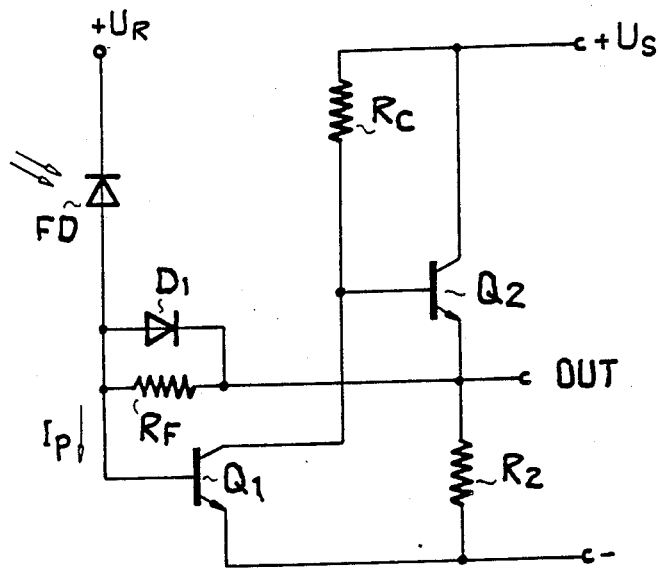
Figure 2:
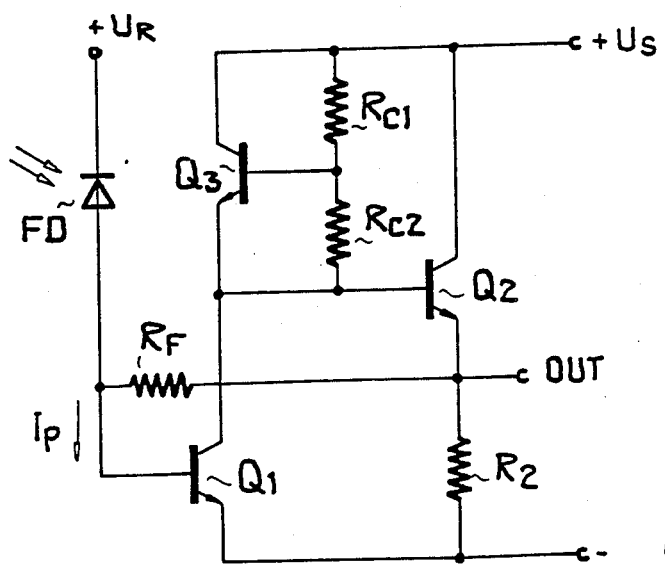
FIG. 2 is a schematic circuit diagram of one embodiment an opto-electronic transimpedance amplifier according to the invention.
Figure 3:
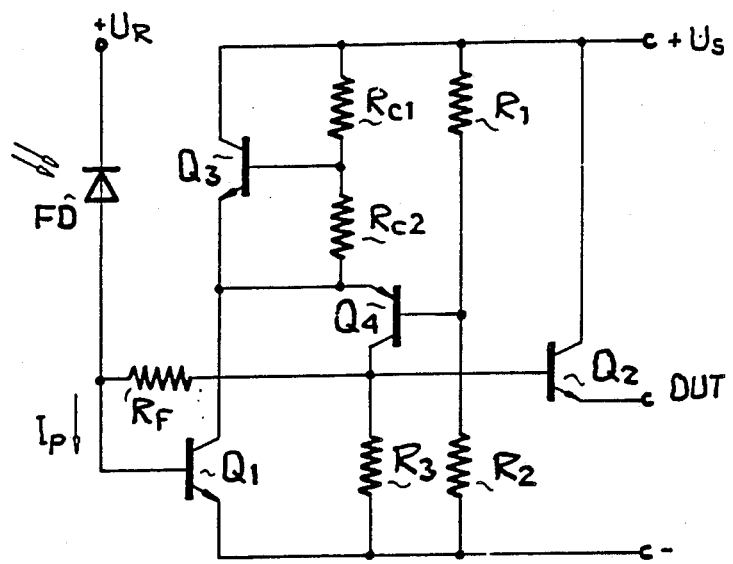
FIG. 3 is a schematic circuit diagram of another embodiment of an opto-electronic transimpedance amplifier according to the invention having four bipolar transistors.
Figure 4:
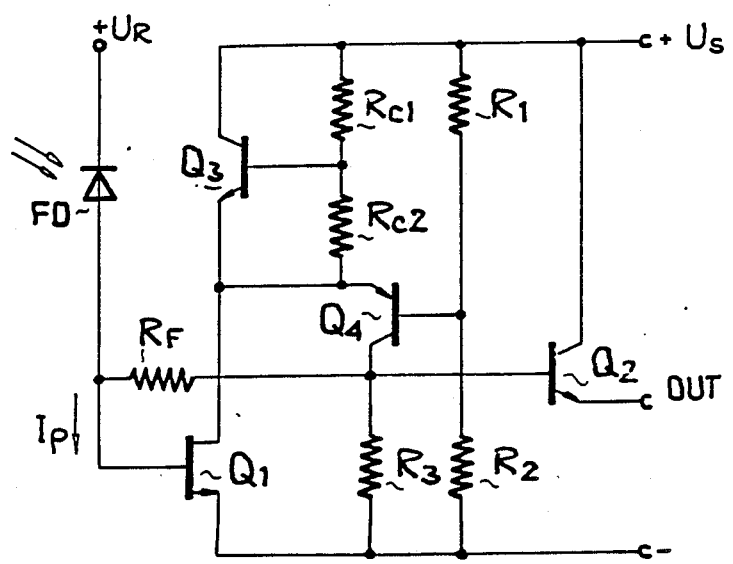
FIG. 4 is a schematic circuit diagram of a modification of the opto-electronic transimpedance amplifier of FIG. 3 with an FET at the input.

FIGS. 2 to 4 show opto-electronic transimpedance amplifiers in accordance with the invention. In the opto-electronic transimpedance amplifiers according to FIG. 2, overload protection is in the form of transistor Q3 with resistors Rc1, Rc2. Transistor Q3 with the resistors Rc1, Rc2 corresponds to an active load resistor for transistor Q1 which forms the input amplifier. The voltage divider comprising resistors Rc1 and Rc2is so dimensioned that in normal operation the voltage between the base and the emitter of the transistor Q3 remains less than approx. 0.4 V. This blocks transistor Q3, and the laod current for transistors Q1 and Q2 flows through the voltage divider Rc1, Rc2. The sum of both resistances Rc1 and Rc2 is the load resistance for transistor Q1.

When the photodiode current Ip exceeds the overload limits (determined by the dimensioning of Rc1, Rc2 and by the operating points of transistors Q1 and Q2), then the current through the voltage divider Rc1, Rc2 and therefore also the base-emitter voltage of transistor Q3 has grown sufficiently for transistor Q3 to switch on and supply the excessive collector current from Q1.

Since the base-emitter voltage of Q3 is between 0.7 and 1 V in active operation, the entire voltage drop via Rc1 and Rc2 is constant and largely independent of the overall current IL, so that transistor Q1 (and also transistor Q2) cannot become saturated. Distortions and delays in the signal that are caused by saturation are therefore largely avoided. The maximum current of amplifier transistors Q3 and Q1, which determines the overload, is now only limited by the temperature (output) strength of these transistors. Overload factors of 200 and more are easily reached.

In the active state, transistor Q3 corresponds to a very small resistor connected parallel to the resistors Rc1, Rc2. This resistor is the collector load resistor of transistor Q1. Since the feedback resistor Rf is not used for overload protection (no additional capacitive load) and the load resistance of the input transistor even becomes smaller, there is no detrimental effect on the bandwidth.

FIG. 3 shows a variant of the transimpedance amplifier of FIG. 2. This variant is made up of four bipolar transistors (Q1... Q4). The transistor Q4 is for displacing the collector potential of the transistor Q4 is connected in a common-base circuit.

FIG. 4 shows a transimpedance amplifier with an FET at the input. Here too the load resistance of the FET is replaced by an active resistor comprising transistor Q3, and resistors Rc1 and Rc2.

What is claimed is:

1. An opto-electronic transimpedance amplifier for the amplification of optical signals supplied by a photovoltaic cell, including: a transistor connected as an amplifier and having a load resistor and a signal input connected to a photovoltaic cell, with said load resistor of the amplifier transistor comprising a transistor and two series connected ohmic resistors whose series connection is connected in parallel with the emitter-to-collector path of the load resistor transistor and whose connection point is connected to the base of the load resistor transistor; and a third transistor provided as an output transistor of the transimpedance amplifier with said third transistor being controlled by the photovoltaic cell.

2. An opto-electronic transimpedance amplifier according to claim 3, wherein both resistors of the load resistor are so dimensioned that in normal operation the voltage between the base and the emitter of the load resistor transistor remains less than 0.4 V.

3. An opto-electronic transimpedance amplifier according to claim 1, wherein the collector of the third transistor is connected to the operating potential.

4. An opto-electronic transimpedance amplifier according to claim 1, wherein a fourth transistor is provided whose emitter is connected to the electrode of the amplifier transistor connected to said load resistor.

5. An opto-electronic transimpedance amplifier for the amplification of optical signals supplied by a photovoltaic cell, including: a transistor connected as an amplifier and having a load resistor and a signal input connected to a photovoltaic cell, with said load resistor of the amplifier transistor comprising a transistor and two series connected ohmic resistors whose series connection is connected in parallel with the emitter-to-collector path of the load resistor transistor and whose connection point is connected to the base of the load resistor transistor; a further transistor whose emitter is connected to the electrode of the amplifier transistor which is connected to said load resistor transistor; and a voltage divider whose tap is connected to the base of the further transistor.

6. An opto-electronic transimpedance amplifier according to cliam 5 wherein said amplifier transistor is a bipolar transistor and said emitter of said further transistor is connected to the collector electrode of said amplifier transistor.

7. An opto-electronic transimpedance amplifier according to claim 5 wherein said amplifier transistor is a field effect transistor and said emitter of said further transistor is connected to the drain of said amplifier transistor.

8. In an opto-electronic transimpedance amplifier for the amplification of optical signals supplied by a photovoltaic cell including: an amplifier transistor having a control electrode connected to a photovoltaic cell and first and second current path electrodes connected in series with a load resistance across a source of operating potential, and an output transistor whose control electrode is responsive to an output signal from said amplifier transistor and having a first current path electrode connected to the one pole of the source of operating potential; the improvement wherein: said load resistance of said amplifier transistor includes a further transistor whose emitter to collector path is connected in series with the current path of said amplifier transistor and in parallel with two series connected ohmic resistors, and whose base is connected to the common connection point of said two series connected ohmic resistors.

9. An opto-electronic transimpedance amplifier according to claim 8 wherein: said first current path electrode of said output transistor is the collector electrode; the emitter of said output transistor, which constitutes the output terminal of said transimpedance amplifier, is connected in series with a first resistor to the opposite pole of the source of potential, and via a second resistor to the base of said amplifier tansistor; and the base of said output transistor is connected to the one of said first and second current path electrodes of said amplifier transistor which is connected to said load resistance.

10. An opto-electronic transimpedance amplifier according to claim 8 wherein said amplifier transistor is a bipolar transistor and said laod resistance is connected to the collector of said amplifier transistor.

11. An opto-electronic transimpedance amplifier according to claim 8 wherein: said first current path electrode of said output transistor is the collector electrode, and the emitter of said output transistor constitutes the output terminal of said transimpedance amplifier; the base of said output transistor is connected via a first resistor to the opposite pole of said source of operating potential and via a second resistor to said control electrode of said amplifier transistor; and another transistor is provided with said another transistor having its emitter connected to the one of said first and second current path electrodes of said amplifier transistor which is connected to said load resistance, having its collector connected to the base of said output transistor, and having its base connected to the tap of a voltage divider connected across said source of operating potential.

12. An opto-electronic transimpedance amplifier according to claim 11 wherein said amplifier transistor is a bipolar transistor whose collector is connected to said emitter of said another transistor.

13. An opto-electronic transimpedance amplifier according to claim 12 wherein said another transistor has a conductivity type opposite that of said amplifier transistor and said further transistor.

14. An opto-electronic transimpedance amplifier according to claim 11 wherein said amplifier transistor is a field effect transistor whose drain is connected to said emitter of said another transistor.

15. An opto-electronic transimpedance amplifier according to claim 14 wherein said another transistor is of the opposite conductivity type as said further transistor.

16. An opto-electronic transimpedance amplifier according to claim 8 wherein said two series connected resistors of said load resistances are dimensioned such that during normal operation the voltage between the base and the emitter of said further transistor is less than 0.4 V, whereby said further transistor is normally non-conducting.

* * * * *